(12) United States Patent
Maniwa

(10) Patent No.: US 12,317,411 B2
(45) Date of Patent: May 27, 2025

(54) GLASS CORE WIRING SUBSTRATE INCORPORATING HIGH-FREQUENCY FILTER, HIGH-FREQUENCY MODULE USING THE SAME, AND METHOD OF MANUFACTURING GLASS CORE WIRING SUBSTRATE INCORPORATING HIGH-FREQUENCY FILTER

(71) Applicant: TOPPAN INC., Tokyo (JP)

(72) Inventor: Susumu Maniwa, Tokyo (JP)

(73) Assignee: TOPPAN INC., Tokyo (JP)

( * ) Notice: Subject to any disclaimer, the term of this patent is extended or adjusted under 35 U.S.C. 154(b) by 296 days.

(21) Appl. No.: 17/960,287

(22) Filed: Oct. 5, 2022

(65) Prior Publication Data

US 2023/0039184 A1 Feb. 9, 2023

Related U.S. Application Data

(63) Continuation of application No. PCT/JP2021/014189, filed on Apr. 1, 2021.

(30) Foreign Application Priority Data

Apr. 7, 2020 (JP) .................................. 2020-069298

(51) Int. Cl.
*H05K 1/02* (2006.01)
*H05K 1/03* (2006.01)
(Continued)

(52) U.S. Cl.
CPC ......... *H05K 1/0233* (2013.01); *H05K 1/0231* (2013.01); *H05K 1/0306* (2013.01);
(Continued)

(58) Field of Classification Search
CPC .. H05K 1/0233; H05K 1/0231; H05K 1/0306; H05K 1/162; H05K 1/165; H05K 3/188
See application file for complete search history.

(56) References Cited

U.S. PATENT DOCUMENTS 10,056,322 B2 * 8/2018 Imayoshi .......... H01L 23/49894
11,881,414 B2 * 1/2024 Sawadaishi ............. C03C 15/00
(Continued)

FOREIGN PATENT DOCUMENTS

EP 4 064 803 A1 9/2022
EP 4 089 724 A1 11/2022
(Continued)

OTHER PUBLICATIONS

International Searching Authority, "International Search Report," issued in connection with International Patent Application No. PCT/JP2021/014189, filed on Apr. 1, 2021.
(Continued)

*Primary Examiner* — Hoa C Nguyen
(74) *Attorney, Agent, or Firm* — Foley & Lardner LLP

(57) ABSTRACT

A glass core wiring substrate incorporating a high-frequency filter having good high-frequency characteristics as a core material and allowing a more efficient arrangement of a conductor in the glass substrate, a module including the same, and a method of manufacturing the glass core wiring substrate incorporating a high-frequency filter. A conductive layer in a glass through a hole in a glass core substrate has a structure in which a hollow cylindrical conductor layer on a side wall of the glass through hole is connected to a cover conductor layer covering one of two openings of the glass through hole. To achieve such a structure, a carrier is attached to one surface of the glass core substrate to cover one of the openings of the glass through hole, and the carrier is peeled off and removed after lamination of the conductor.

11 Claims, 15 Drawing Sheets

(51) Int. Cl.
H05K 1/16 (2006.01)
H05K 3/18 (2006.01)
(52) U.S. Cl.
CPC ............. H05K 1/162 (2013.01); H05K 1/165 (2013.01); H05K 3/188 (2013.01)

(56) References Cited

U.S. PATENT DOCUMENTS

2014/0020940 A1* 1/2014 Mano .................... H05K 1/186
174/258
2019/0304888 A1* 10/2019 Takano .................... H05K 1/11
2021/0143787 A1 5/2021 Shirasaki et al.

FOREIGN PATENT DOCUMENTS

| JP | 2014-165362 A | 9/2014 |
| JP | 2017-005205 A | 1/2017 |
| JP | 2018-107419 A | 7/2018 |
| WO | WO-2019/225698 A1 | 11/2019 |

OTHER PUBLICATIONS

International Searching Authority, "Written Opinion," issued in connection with International Patent Application No. PCT/JP2021/014189, filed on Apr. 1, 2021.
Extended European Search Report issued in connection with EP Appl. No. 21783814.3 dated Aug. 25, 2023.

* cited by examiner

GLASS CORE WIRING SUBSTRATE INCORPORATING HIGH-FREQUENCY FILTER, HIGH-FREQUENCY MODULE USING THE SAME, AND METHOD OF MANUFACTURING GLASS CORE WIRING SUBSTRATE INCORPORATING HIGH-FREQUENCY FILTER

ROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2021/014189, filed on Apr. 1, 2021, which in turn claims the benefit of JP 2020-069298, filed Apr. 7, 2020 the disclosures of all which are incorporated herein by reference in its entirety.

TECHNICAL FIELD

The present invention relates to a glass core wiring substrate incorporating a high-frequency filter, a high-frequency module using the same, and a method of manufacturing a glass core wiring substrate incorporating a high-frequency filter.

BACKGROUND

Due to development of mobile communication devices with higher performance, electronic components mounted on mobile communication devices are required to have higher density and smaller size. Furthermore, an increase in the number of electronic components mounted on electronic substrates is also required.

In recent years, for high-speed and high-capacity data communication, mobile devices increasingly use carrier aggregation (hereinafter abbreviated as CA) technology, which simultaneously uses frequencies in a plurality of bands in the MHz to GHz range. The CA technology filters signals in a single module to optimize a circuit in order to avoid mutual interference of frequency band signals that are simultaneously used. The optimization of the circuit requires an appropriate filter configured to accurately acquire a frequency band to be used and block signals at frequencies in adjacent frequency bands.

Transmission/reception methods for mobile devices are broadly divided into frequency division duplex (hereinafter abbreviated as FDD) systems and time division duplex (hereinafter abbreviated as TDD) systems. Some recent front-end modules use an FDD system and a TDD system in combination. FDD systems use a set of adjacent frequency bands for transmission and reception, and thus use a surface-mount filter such as a BAW filter or a SAW filter that has sharp attenuation characteristics and selects a narrow frequency band of 20 to 100 MHz. On the other hand, a TDD system uses a single frequency band allocated to time slots for transmission and reception, and uses a wider frequency band than an FDD system.

Due to the need for advanced synchronization techniques, fifth-generation mobile communication systems require a TDD system filter having an even wider passband of 500 to 900 MHz. BAW filters and SAW filters are for frequency bands of Sub-6 GHz (3.7/4.5 GHz) or higher. Thus, it is difficult for a BAW filter or a SAW filter to cover a relatively wide frequency band including the 400 MHz to 900 MHz bands required for a TDD system. Surface-mounted LC filters made of LTCC are components having characteristics of filtering a wide frequency band, but due to their structure, they tend to be thick and difficult to accommodate in the casing of a mobile terminal. Thus, there have been demands for smaller and thinner LC filters having characteristics equivalent to or better than those of existing LC filters, or substrates incorporated with such LC filters.

In the front-end modules described above, a large number of passive components including a filter, active components, and the like are mounted on the front-end module substrate. In order to achieve high-speed and high-capacity communication using various frequency bands, the increase in the number of components mounted on the substrate is expected to continue in the future.

In view of this, there has been proposed a technique to incorporate an LC filter composed of an inductor and a capacitor as a frequency filter in a multilayer wiring substrate to achieve a smaller multilayer wiring substrate having reduced height and fewer components. LC filters can have wider transmission bands than acoustic wave filters such as BAW filters and SAW filters, and are highly compatible with TDD systems. An inductor and a capacitor as components of the filter both have a relatively simple structure, and are thus relatively easily processed as with other wires and the like incorporated in the substrate. Furthermore, a multilayer wiring substrate incorporating an LC filter can have a lower height than a multilayer wiring substrate incorporating an LTCC filter.

In an LC filter incorporated in a multilayer wiring substrate, a capacitor as a component of the LC filter has, for example, a structure called MIM (metal-insulator-metal) in which a metal layer, a dielectric layer, and a metal layer are laminated parallel to a multilayer structure of the wiring substrate. Due to the electrical capacitance required for the LC filter, the dielectric layer of the MIM structure has a thickness of one several hundredth of the thickness of an insulator layer of the multilayer wiring substrate. Thus, it is rarely possible to use a laminated structure of a buildup layer as it is to form a MIM structure. A MIM structure is typically formed by laminating a lower electrode as part of a metal layer of the buildup layer, and forming a dielectric layer and an upper electrode layer above the lower electrode separately from the buildup layer.

On the other hand, an inductor as a component of the LC filter may be configured in various manners. For example, an inductor may be formed to have a spiral shape by processing a conductor layer of the multilayer wiring substrate as with other wires. Alternatively, an inductor may be formed by placing a wire on each of two conductor layers sandwiching the insulator layer, forming a through electrode in the insulator layer, and connecting the wires on both of the conductor layers to the through electrode to obtain a coil wound around the insulator layer in a spiral manner. In some cases, a single turn of wire may be excessive for the desired inductance. In such a case, it is possible to use a magnetic field generated around a wire when an electric current is applied to the wire.

As described above, recent mobile devices tend to use high frequency bands, leading to problems unique to high frequencies such as the skin effect of an electric current. For example, even a small unevenness in a cross section of the wire may adversely affect the electrical properties of the entire substrate. Furthermore, the materials are required to meet higher standards for insulating properties, dielectric constant, dielectric loss tangent, and the like.

In such circumstances, Patent Literature 1 discloses a wiring substrate in which a core layer is composed of glass.

Glass substrates have high flatness and smoothness, high suitability for fine wire formation similar to that of silicon substrates, and better insulating properties than silicon substrates. In addition, glass is not especially expensive in terms of cost, and is one of the best materials as a core substrate of a high-frequency multilayer wiring substrate.

[Citation List] [Patent Literature] [PTL 1] WO 2019-225698 A

SUMMARY OF THE INVENTION

Technical Problem

When glass is used as a core substrate, a method of electrically connecting the front and rear surfaces of the core substrate needs to be considered. Usually, a through hole is formed in the glass, and a conductive layer is laminated on an inner wall of the through hole to form a through electrode. However, glass typically has relatively low adhesion to a conductor typified by a metal.

Thus, a technique is often used in which a substance having high adhesion in particular to glass is prepared as a material of a layer directly in contact with the glass, and the material is deposited on the glass by a method that allows formation of a layer having high adhesion, and other layers are laminated on the layer. For example, titanium may be deposited on the glass by sputtering. In a subsequent step, for example, copper is further laminated on the titanium layer by sputtering to ensure high conductivity, and then copper is deposited to form a copper layer having the desired thickness by electrolytic plating, which allows deposition at high speed.

In this case, sputtering and electrolytic plating usually cause formation of a conductor on one or both surfaces of the glass substrate simultaneously with formation of a conductor on the inner wall of the through hole. In such a case, the thickness of the conductor is almost the same on the inner wall of the through hole and on one or both surfaces of the glass. Considering that the through hole in the glass currently has an inner diameter of 50 μm or more and that the glass has a relatively large thickness, layer formation in which the through hole is completely filled with the conductor requires an excessive amount of time, and may cause defects such as voids in the through hole.

Thus, a conductor layer is usually laminated on the inner wall of the through hole so that the entire conductor layer is conformally formed in the hole (formed along the inner peripheral surface of the hole) and that the conductor layer has a thickness determined in view of the thickness required for the conductor layer formed on the glass surface. A portion of the through hole that has no laminated conductor is hollow when the conductor layer is formed. Then, when an insulating layer is laminated later on the front and rear surfaces of the glass plate, the hollow space is filled with the insulating layer.

A problem arises when a conductor layer is conformally laminated on the inner wall of the through hole in the glass substrate in this manner. At the openings of the through hole, only the conductor is located at the edge of the openings as viewed perpendicular to the glass substrate. Thus, when a through electrode provided on the insulating layer is overlapped with the glass through hole to form a stacked via, the through electrode cannot be electrically connected to a layer laminated on the glass substrate.

In the communications field, which is a major field of application of high-frequency filters, miniaturization of communication terminals is always an important issue. A stacked via allows a spatially efficient arrangement of a through electrode for electrical connection between layers of a multilayer substrate. If a stacked via cannot be used, the use of glass as a material of a high-frequency filter may become less advantageous.

The present invention has been made in view of such problems, and an object of the present invention is to provide a glass core wiring substrate incorporating a high-frequency filter including a glass core wring substrate incorporating a high-frequency filter characteristics as a core material and allowing a more efficient arrangement of a conductor in the glass substrate, a high-frequency module including the glass core wiring substrate incorporating a high-frequency filter, and a method of manufacturing the glass core wiring substrate incorporating a high-frequency filter.

Solution to Problem

In order to solve the above problems, the glass core wiring substrate incorporating high-frequency filter, of the present invention, includes a glass core substrate having a glass through hole penetrating from the first main surface to the second main surface facing the first main surface, wherein an inductor is provided which includes a through electrode composed of a hollow cylindrical conductor layer and a cover conductor layer, the hollow cylindrical conductor layer being composed of a seed layer and a main conductive layer laminated in this order on an inner wall of the glass through hole, the cover conductor layer being composed of a portion of the seed layer and a portion of the main conductive layer of the hollow cylindrical conductor layer extending to block an edge of the glass through hole on the second main surface, a capacitor is provided which has a multilayer structure composed of a conductor layer, an insulator layer, and a conductor layer laminated in this order on the first main surface or the second main surface, the capacitor and the inductor connected to each other constitute a high-frequency LC filter, and a conductor layer adhered to the second main surface of the glass core substrate is in contact with the cover conductor layer of the through electrode.

A method of manufacturing a glass core wiring substrate incorporating a high-frequency filter of the present invention includes forming a plurality of glass through holes extending from a first main surface to a second main surface of a glass core substrate, attaching a carrier material to the second main surface, forming a conductor layer on the first main surface and the second main surface of the glass core substrate, forming a hollow cylindrical conductor layer along an inner wall of the glass through holes and forming a cover conductor layer on the carrier material that blocks ends of the glass through holes on the second main surface, peeling off and removing the carrier material from the second main surface, forming an inductor by sequentially connecting the hollow cylindrical conductor layer and the cover conductor layer in the glass through holes, and forming a capacitor by using the conductor layer formed on the first main surface or the second main surface.

Advantageous Effects of the Invention

The present invention provides a glass core wiring substrate incorporating a high-frequency filter, including a glass substrate having good high-frequency characteristics as a core material and allowing a more efficient arrangement of a conductor in the glass substrate, a high-frequency module including the glass core wiring substrate incorporating the high-frequency filter, and a method of manufacturing the glass core wiring substrate incorporating the high-frequency filter.

BRIEF DESCRIPTION OF THE DRAWINGS

Brief Description of the Drawings

Figure 1:
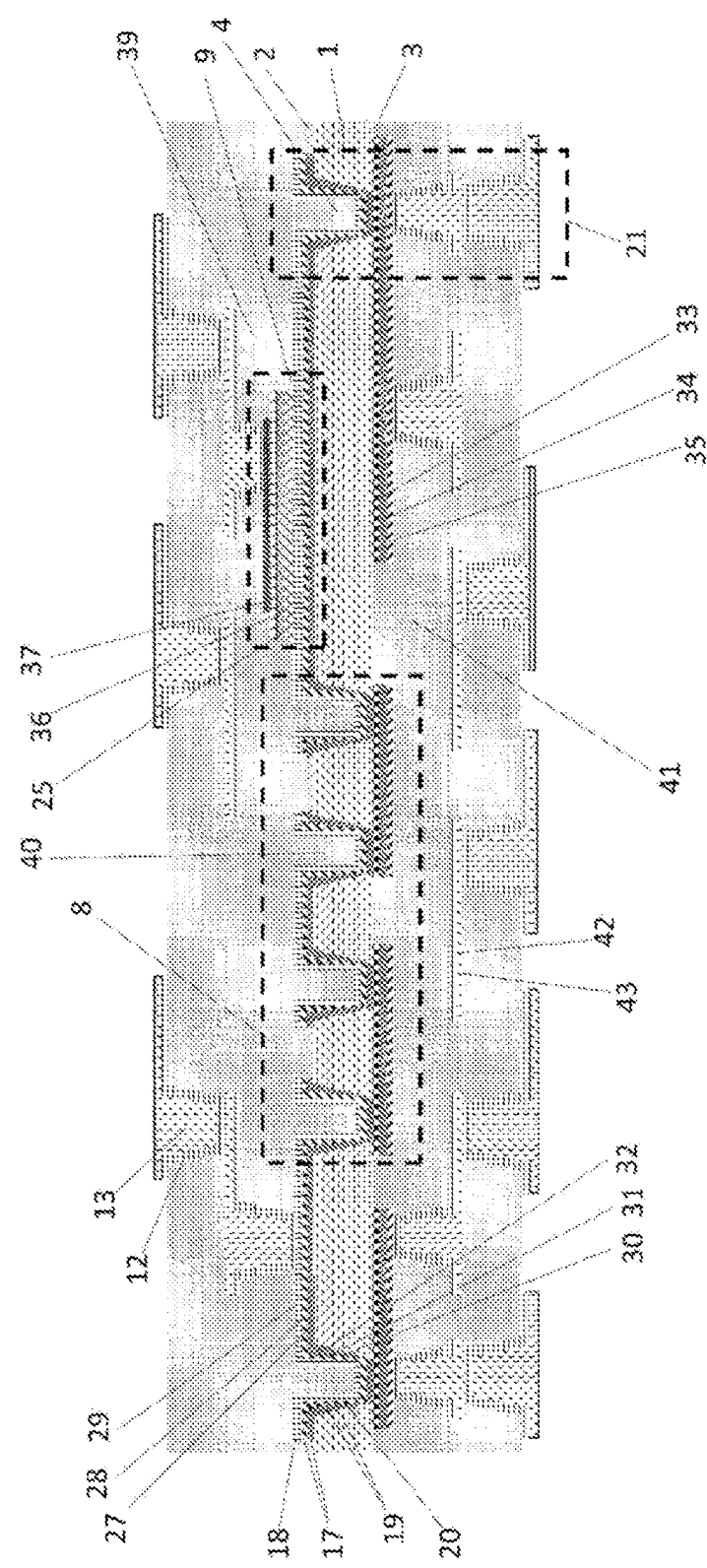

FIG. 1 is a cross-sectional view of a glass core wiring substrate incorporating a high-frequency filter according to the present embodiment.

Figure 2:
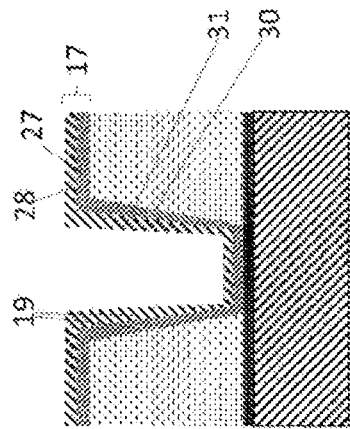
Figure 2:
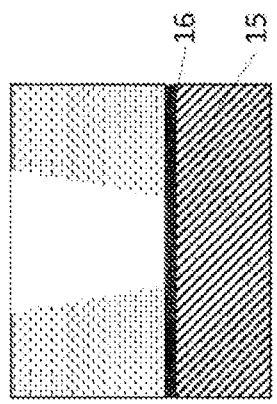
Figure 2:
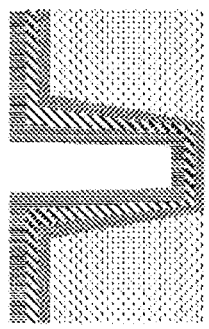
Figure 2:
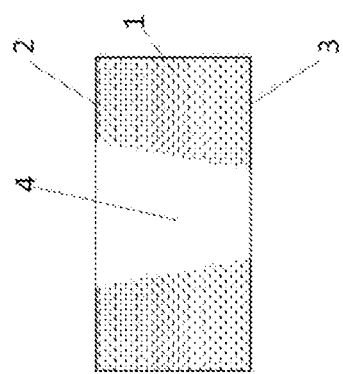
Figure 2:
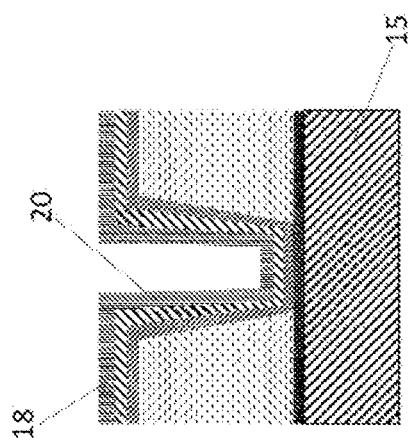

FIGS. 2 (a)-2(e) are reference diagrams showing a structure of a conductive layer in a glass through hole according to the present embodiment.

Figure 3:
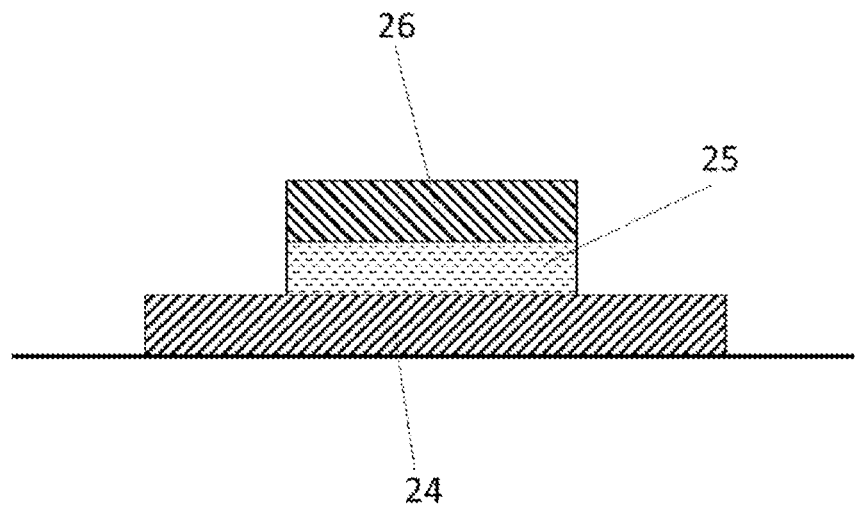

FIG. 3 is a cross-sectional view of a capacitor in the present embodiment.

Figure 4:
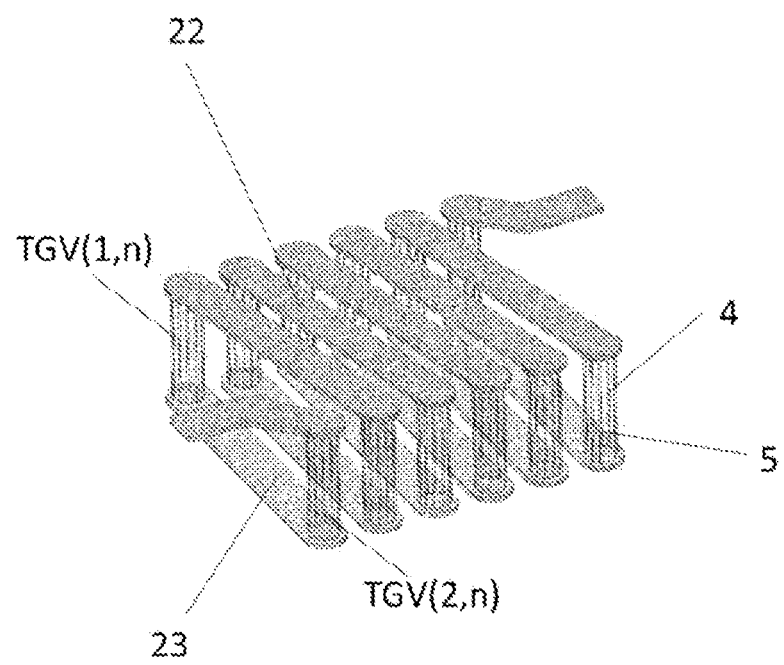

FIG. 4 is a perspective view of an inductor in the present embodiment.

Figure 5:
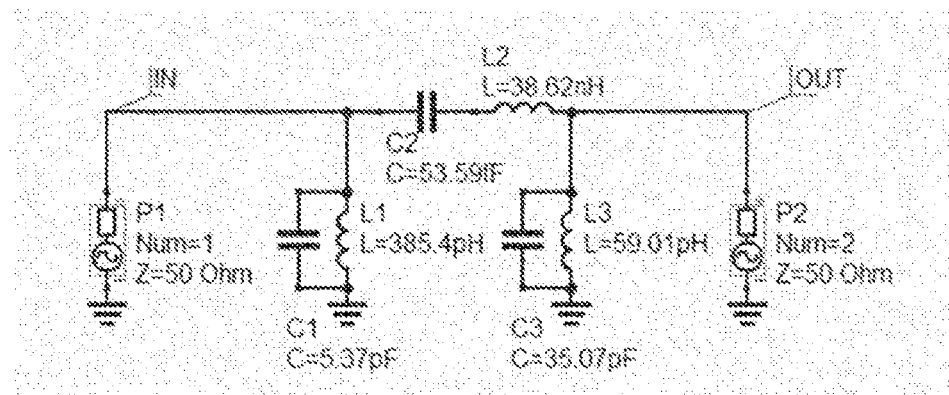

FIG. 5 is a circuit diagram of a bandpass filter in the present embodiment.

Figure 6:
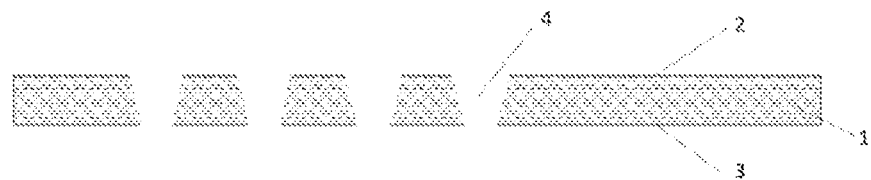
Figure 6:
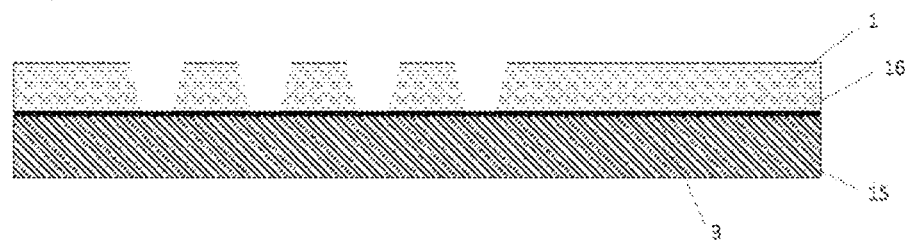

FIGS. 6(a) and 6(b) are diagrams showing a process of manufacturing the wiring substrate according to the present embodiment.

Figure 7:
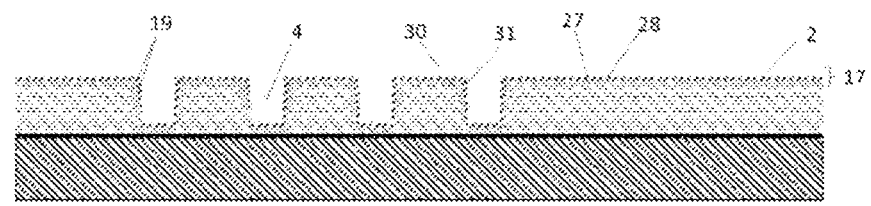
Figure 7:
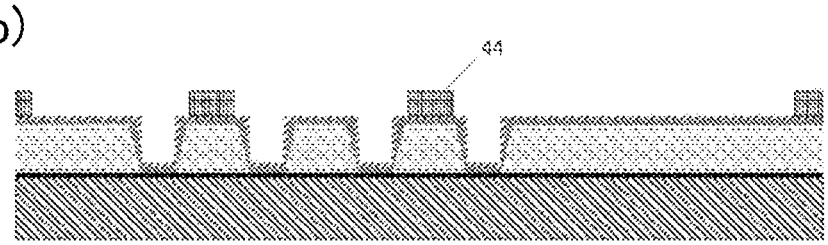

FIGS. 7(a) and 7(b) are diagrams showing a process of manufacturing the wiring substrate according to the present embodiment.

Figure 8:
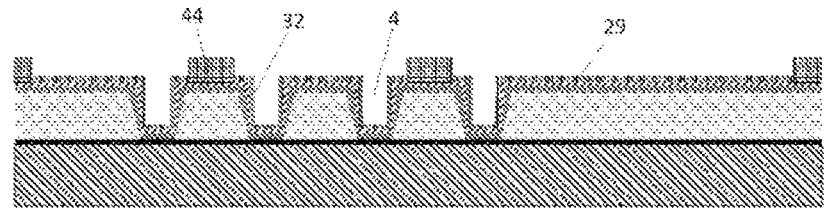
Figure 8:
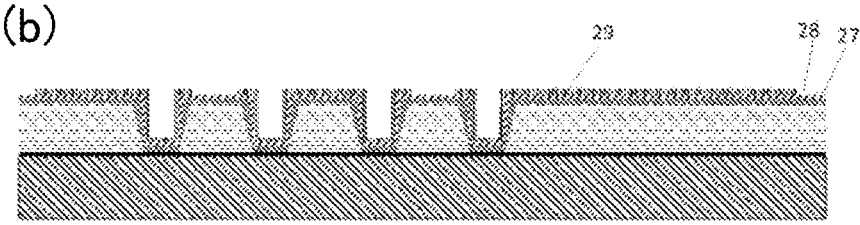

FIGS. 8(a) and 8(b) are diagrams showing a process of manufacturing the wiring substrate according to the present embodiment.

Figure 9:
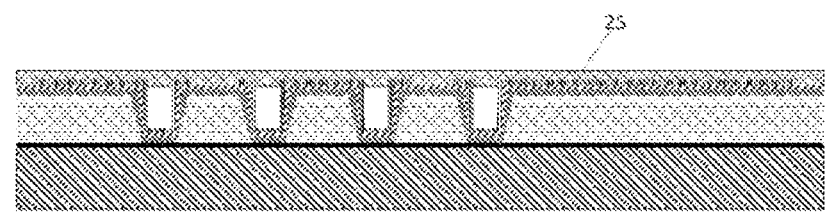
Figure 9:
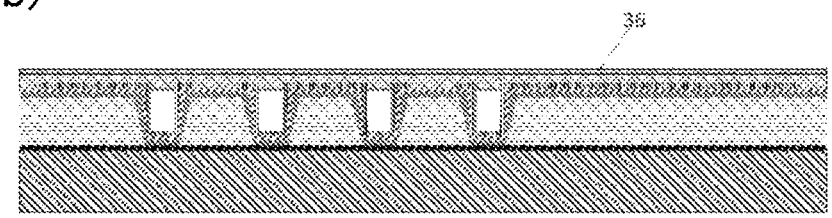

FIGS. 9(a) and (b) are diagrams showing a process of manufacturing the wiring substrate according to the present embodiment.

Figure 10:
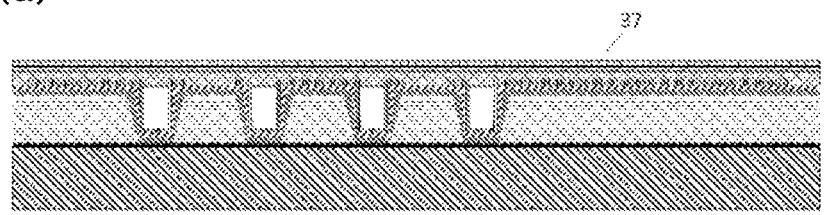
Figure 10:
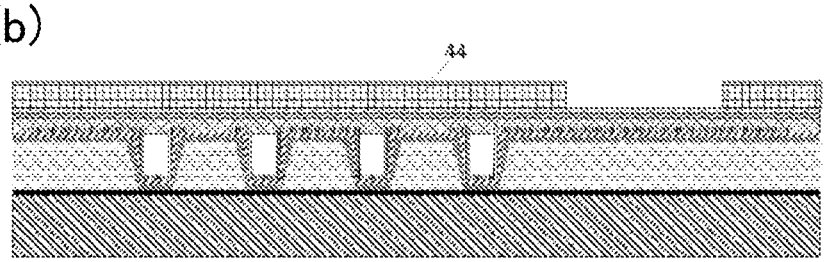

FIGS. 10(a) and 10(b) are diagrams showing a process of manufacturing the wiring substrate according to the present embodiment.

FIGS. 11(a) and 11(b) are diagrams showing a process of manufacturing the wiring substrate according to the present embodiment.

Figure 12:
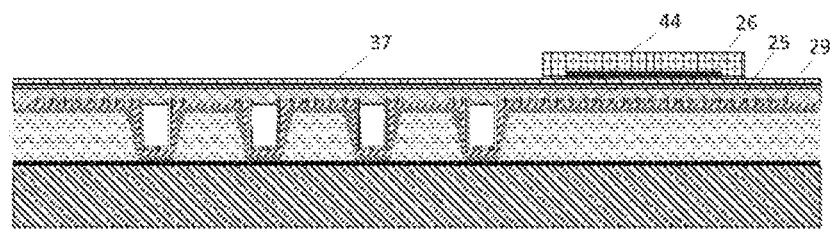

FIG. 12 is a diagram showing a process of manufacturing the wiring substrate according to the present embodiment.

FIGS. 13(a) and 13(b) are diagrams showing a process of manufacturing the wiring substrate according to the present embodiment.

FIGS. 14(a) and 14(b) are diagrams showing a process of manufacturing the wiring substrate according to the present embodiment.

FIGS. 15(a) and 15(b) are diagrams showing a process of manufacturing the wiring substrate according to the present embodiment.

FIGS. 16(a) and 16(b) are diagrams showing a process of manufacturing the wiring substrate according to the present embodiment.

FIGS. 17(a) and 17(b) are diagrams showing a process of manufacturing the wiring substrate according to the present embodiment.

FIGS. 18(a) and 18(b) are diagrams showing a process of manufacturing the wiring substrate according to the present embodiment.

FIGS. 19(a) and 19(b) are diagrams showing a process of manufacturing the wiring substrate according to the present embodiment.

Figure 20:
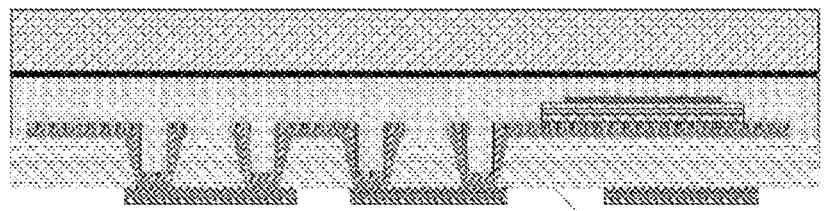
Figure 20:
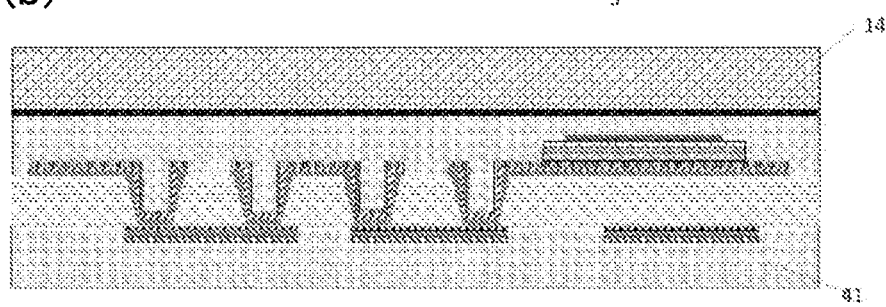

FIGS. 20(a) and 20(b) are diagrams showing a process of manufacturing the wiring substrate according to the present embodiment.

Figure 21:
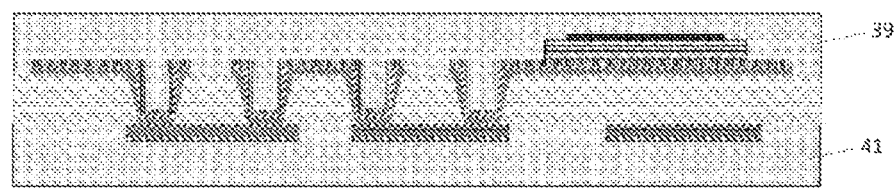
Figure 21B:
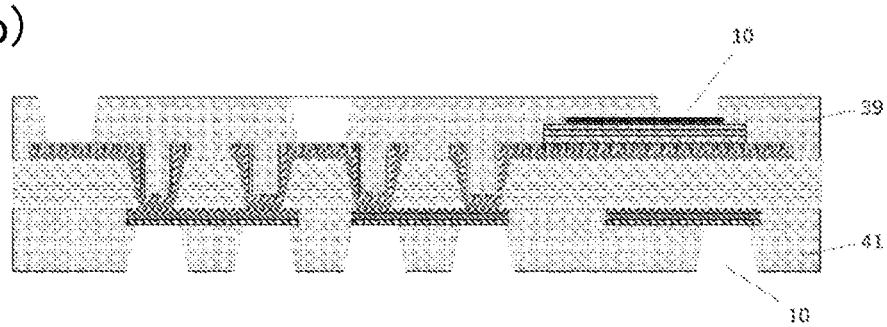

FIGS. 21(a) and 21(b) are diagrams showing a process of manufacturing the wiring substrate according to the present embodiment.

Figure 22:
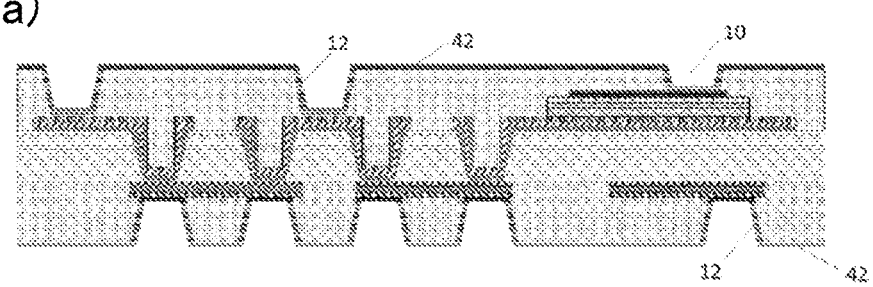
Figure 22:
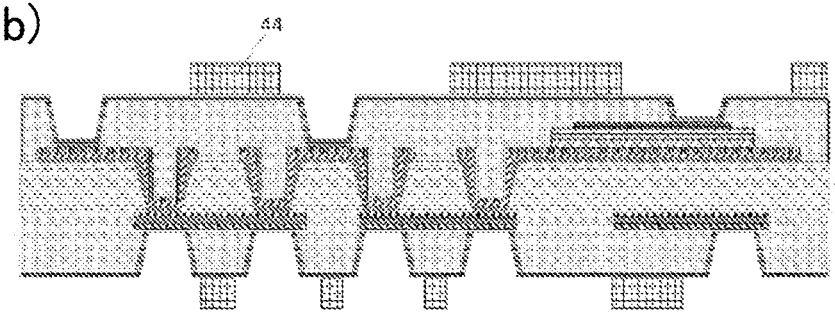

FIGS. 22(a) and 22(b) are diagrams showing a process of manufacturing the wiring substrate according to the present embodiment.

Figure 23:
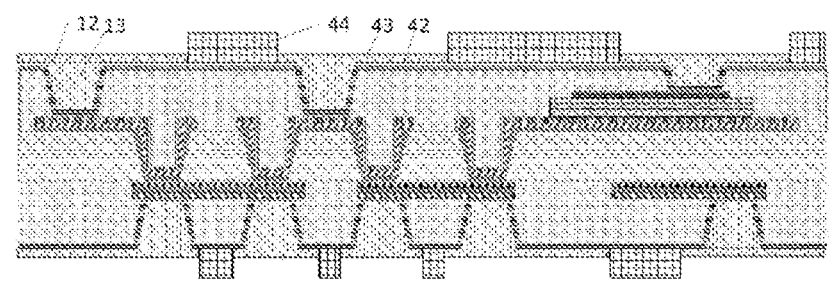
Figure 23:
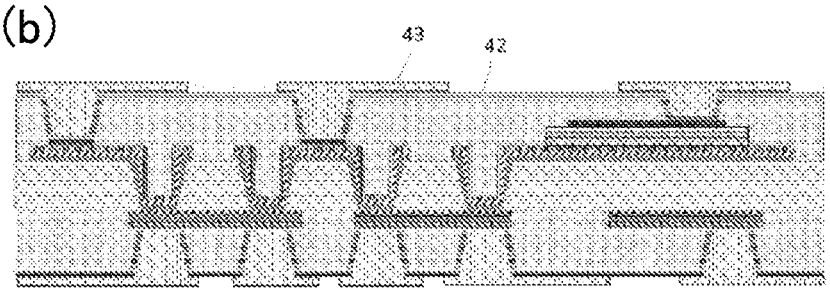

FIGS. 23(a) and 23(b) are diagrams showing a process of manufacturing the wiring substrate according to the present embodiment.

Figure 24:
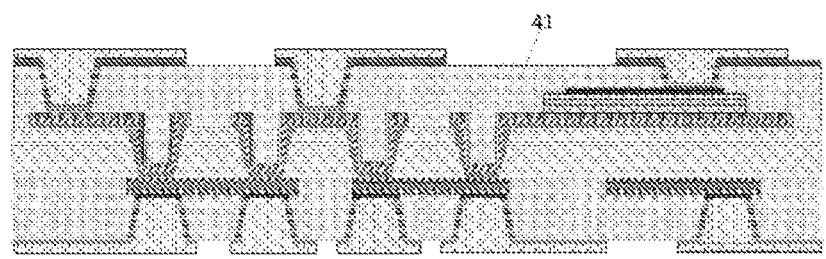

FIG. 24 is a diagram showing a process of manufacturing the wiring substrate according to the present embodiment.

Figure 25:
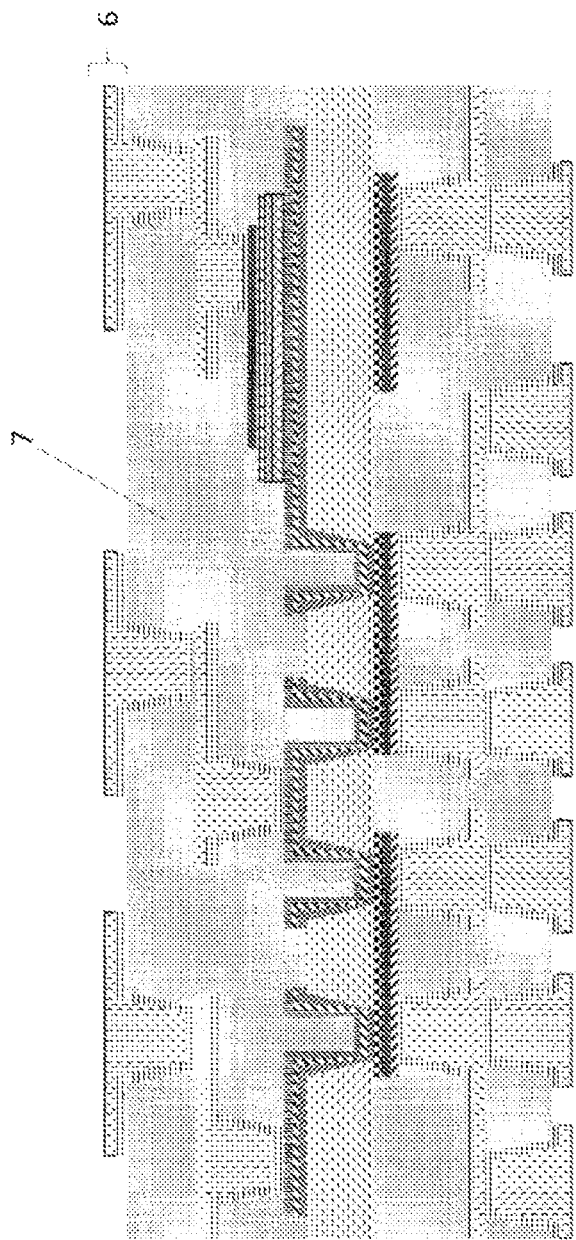

FIG. 25 is a diagram showing a process of manufacturing the wiring substrate according to the present embodiment.

DETAILED DESCRIPTION

Embodiments of the present invention will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention. For the sake of clarity, the drawings may be illustrated in an exaggerated manner as appropriate.

In any group of successive numerical value ranges described in the present specification, the upper limit value or lower limit value of one numerical value range may be replaced with the upper limit value or lower limit value of another numerical value range. In the numerical value ranges described in the present specification, the upper limit values or lower limit values of the numerical value ranges may be replaced with values shown in examples. The configuration according to a certain embodiment may be applied to other embodiments.

The embodiments of the present invention are a group of embodiments based on a single unique invention. The aspects of the present invention are those of the group of embodiments based on a single invention. Configurations of the present invention can have aspects of the present disclosure. Features of the present invention can be combined to form the configurations. Therefore, the features of the present invention, the configurations of the present invention, the aspects of the present disclosure, and the embodiments of the present invention can be combined, and the combinations can have a synergistic function and exhibit a synergistic effect.

Also, as s used herein, the term "upper" refers to a position farther from a glass core, and the term "lower" refers to a position closer to the glass core.

A glass core wiring substrate incorporating a high-frequency filter (hereinafter referred to as a wiring substrate) according to the present embodiment is composed of a glass core substrate having a through hole, and has a MIM capacitor structure on a lamination surface. The capacitor structure serves as an electronic component constituting an LC resonant circuit or a capacitive passive component used for wireless communication for mobile devices or the like.

As shown in FIG. 1, the wiring substrate includes a glass core substrate 1 composed of glass. In a cross section of the glass core substrate 1, a first main surface 2 refers to one surface of the glass core substrate 1, and a second main surface 3 refers to the other surface of the glass core substrate 1. The glass core substrate 1 has a through hole (glass through hole) 4 substantially vertically penetrating the glass core substrate 1 between the first main surface 2 and the second main surface 3. On each of the first main surface 2 and the second main surface 3, a conductive layer and an insulating resin layer (insulator layer) are alternately laminated. The glass core substrate 1 has the through hole 4 as a portion electrically connecting adjacent conductor layers, and is provided with an inductor 8, and a capacitor 9 on the glass. By mounting an electronic component, a semiconductor element, and the like on the wiring substrate shown in FIG. 1, a high-frequency module is obtained. A high-frequency module is formed by providing an electrode section so that the electrode section is exposed from the outermost layer of the wiring substrate, and connecting another high-frequency component to the electrode section to mount the high-frequency component on the wiring substrate.

A structure of a through electrode of the through hole 4 in the glass core substrate 1 and a method of producing the through electrode will be described. The production method is an example, and is not limited to this.

As shown in FIG. 2(a), a through hole 4 is formed in the glass core substrate 1, and as shown in FIG. 2(b), a carrier 15 is attached to the second main surface 3 via an adhesive layer 16.

Then, as shown in FIG. 2(c), from the upper side of the first main surface 2, seed layers 17 and 19 are formed on the first main surface 2 and in the through hole 4. The end of the through hole 4 on the second main surface 3 of the glass core substrate 1 is closed by the carrier 15; thus, the seed layers 17 and 19 are formed on the carrier 15 (and the adhesive layer 16).

In FIG. 2(c), the seed layers 17 and 19 are each shown as two layers. In practice, the materials of layers to be laminated are often selected so that the lowermost layer has adhesion and a layer above the lowermost layer has conductivity. In the present embodiment, from the side closer to the glass core substrate 1, titanium layers 27 and 30 and copper layers 28 and 31 are formed in this order by sputtering. However, these layers may not necessarily be formed in this manner, and the layer formation method may be selected as desired according to the purpose.

Then, as shown in FIG. 2(d), main conductive layers 18 and 20 are formed, and finally as shown in FIG. 2(e), the carrier 15 is peeled off and removed.

When the carrier 15 is peeled off and removed, the seed layer 19 and the main conductive layer 20 have enough rigidity to maintain their shape. The seed layer 19 and the main conductive layer 20 are separated from the carrier 15 and remain on the through hole 4 side to cover the end of the through hole 4 on the second main surface 3. Thus, on the bottom of the through hole 4 on the second main surface 3, the layers are formed in the same order as on the first main surface 2 of the glass core substrate 1 and are connected to the respective layers formed on the side wall of the through hole 4. The seed layer 19 and the main conductive layer 20 formed on the inner wall of the through hole 4 are referred to as a hollow cylindrical conductor layer, and the seed layer 19 and the main conductive layer 20 formed on the carrier 15 are referred to as a cover conductor layer. The hollow cylindrical conductor layer and the cover conductor layer constitute a through electrode.

The through hole 4 is hollow, and the hollow space is filled with an insulating resin layer in a later step. This reinforces the main conductive layer 20 as a thin film in the through hole 4, and this makes it possible to overlay a conductor on the main conductive layer 20 to form a stacked via.

The inductor 8 has, for example, the shape shown in FIG. 4. In FIG. 4, the parallel flat glass core substrate 1 including through electrodes arranged in two columns is shown transparent. Wires 22 and 23 are provided to connect the openings of a plurality of through holes 4 penetrating the glass core substrate between the first main surface and the second main surface, and a main conductive layer is provided on an inner wall of the through holes 4 connecting the front and rear surfaces of the glass plate, thereby forming through conductive vias 5 (hereinafter referred to as TGVs).

The nth TGV in the first column is referred to as TGV (1, n), and the nth TGV in the second column is referred to as TGV (2, n). When the TGV (1, n) is connected to the TGV (2, n) by the wire 23 on the rear surface, and the TGV (1, n) is connected to the TGV (2, n+1) by the wire 22 on the front surface, the wire 23, the TGV (1, n), the wire 22, and the TGV (1, n+1) form an open circuit in which a single turn of conductor is wound around the inner portion and surface of the glass plate. By passing an electric current through the circuit, the circuit can function as an inductor. The characteristics of the inductor can be adjusted, for example, by changing the number of turns.

The capacitor 9 has a MIM structure in which a dielectric is sandwiched between two conductor plates. FIG. 3 shows an example of the capacitor including a lower electrode 24 laminated directly on the glass substrate to form a conductor pattern, a dielectric layer 25 laminated on the conductor pattern, and a conductor 26 as an upper electrode laminated on the dielectric layer 25. The lower electrode 24 and the upper electrode 26 typically have a multilayer structure composed of a seed layer and a main conductive layer. The capacitance of the capacitor 9 is determined by the area of a portion of the upper electrode 26 that is overlapped with the lower electrode 24 and the interval between the lower electrode 24 and the upper electrode 26. The capacitor 9 may be provided on either the first main surface 2 or the second main surface 3 of the glass core substrate 1.

Next, a high-frequency LC filter incorporated in the wiring substrate of the present embodiment will be described in detail. An LC filter uses a resonance phenomenon of an inductor and a capacitor to allow an electrical signal at a specific frequency to penetrate a circuit and to block electrical signals at the other frequencies. However, in practice, the frequency to be passed is not a single frequency, but is a certain specified range, and the boundary between passing and blocking does not occur in a simple on-off manner, but the transmission response changes with a finite gradient, and the finite gradient is usually restricted from a performance point of view.

Thus, an LC filter is not designed to include a pair of an inductor and capacitor, but is designed to include two or more inductors and capacitors to satisfy, as a whole, the detailed needs for transmission and blocking of electrical signals.

FIG. 5 shows, as an example, a circuit diagram of an LC filter intended to have a transmission frequency band of 3.3 GHz to 3.7 GHz. In FIG. 5, C1 to C3 indicate capacitors, and L1 to L3 indicate inductors. Table 1 shows the capacitances of the capacitors C1 to C3, and Table 2 shows the inductances of the inductors L1 to L3.

TABLE 1

|  | C1 | C2 |
|---|---|---|
| Capacitance | 5.37 pF | 53.59 fF |
| Dielectric | SiN | SiN |
| Relative permittivity | 6.3 | 6.3 |
| Dielectric thickness | 200 nm | 200 nm |
| Side length | 138.7 μm | 13.9 μm |

TABLE 2

|  | L1 | L2 | L3 |
|---|---|---|---|
| Inductance | 385.4 pH | 38.62 nH | 59.01 pH |
| Number of turns |  | 11 |  |
| Coil width |  | 1.6 mm |  |
| Coil length |  | 1.5 mm |  |
| Coil thickness |  | 0.3 mm |  |
| Wire length | 1.33 mm |  | 0.2 mm |
| Wire width | 0.1 mm |  | 0.1 mm |
| Wire thickness | 15 μm |  | 15 μm |

In Table 2, the inductors for which the column for the number of turns is left blank indicate inductors in which due to an extremely low inductance, even a single turn is excessive in a wire with a scale that can be achieved in a typical process, and thus the desired inductance needs to be achieved by the self-inductance of a single wire.

The circuit in the circuit diagram requires a plurality of capacitors and a plurality of inductors. However, to avoid complication, the explanatory diagrams of the present embodiment show a simplified substrate including a single inductor and a single capacitor. The capacitor is required to have an extremely low capacitance as in C2 in Table 1. Thus, the capacitor shown in the drawings is a thin-film capacitor having an extremely low capacitance.

(Manufacturing Method)

Next, a process of manufacturing the wiring substrate of the present embodiment will be described with reference to the cross-sectional views in FIGS. 6 to 25.

First, as shown in FIG. 6(a), through holes 4 are formed in the glass core substrate 1. The type of the glass core substrate 1 may be selected as desired from an alkali-free glass, an alkali glass, a quartz glass, and the like according to the intended use. In the present embodiment, an alkali-free glass having a thickness of 200 μm is used. A processing method for forming the through holes 4 may be appropriately selected from laser processing, etching processing, electric discharge machining, a combination thereof, and the like. In the present embodiment, laser processing is used. In FIG. 6(a), the diameter of the opening of the through holes 4 on the front surface of the core glass differs from the diameter of the opening of the through holes 4 on the rear surface of the core glass. Although this is not essential, the first main surface 2 refers to that having larger diameter openings and the second main surface 3 refers to that having smaller openings, on the glass core substrate.

Then, as shown in FIG. 6(b), a carrier glass (glass plate) 15 having a thickness of 500 μm is attached to the second main surface 3 of the glass core substrate 1. An adhesive layer 16 with low adhesion having a thickness of 10 μm is provided on the entire surface of the carrier glass 15. Thus, the carrier glass 15 can be attached to the second main surface 3 of the glass core substrate 1 via the adhesive layer 16.

Then, as shown in FIG. 7(a), from the upper side of the first main surface 2 of the glass core substrate 1, titanium layers 27 and 30 and copper layers 28 and 31 are laminated in this order by sputtering on the surface including the first main surface 2 of the glass core substrate 1 and the inner walls of the through holes 4. The layers may be laminated so that the titanium layers have a thickness of 50 nm and the copper layers have a thickness of 300 nm. By forming the layers under processing conditions determined in advance, the layers are substantially uniformly formed to cover the entire side wall of the through holes 4 from the first main surface 2 side to the second main surface 3 side and to extend on the glass carrier 15 covering the through holes 4 at the openings of the through holes 4 on the second main surface 3.

Then, as shown in FIG. 7(b), a photoresist layer 44 is formed on the first main surface 2 side of the glass core substrate 1, and the photoresist is patterned to expose a portion of the photoresist to be a wiring pattern later. The photoresist layer has a thickness of 20 μm.

Then, as shown in FIG. 8(a), a copper layer 29 is laminated by electrolytic plating on a portion of the pattern of the photoresist layer 44 on the first main surface 2 of the glass core from which the photoresist has been removed to expose the base. The processing conditions can be set in advance so that the target thickness of the copper layer 29 is 12 μm. It has been confirmed by an experiment that by electrolytic plating under the same conditions, in the through holes 4, a conformal electrolytic plating layer 32 is formed to be overlaid on the layers formed by sputtering.

Then, as shown in FIG. 8(b), the photoresist layer 44 is removed using a predetermined peeling liquid under predetermined peeling conditions.

Then, as shown in FIG. 9(a), a dielectric layer is formed. The dielectric layer is sandwiched between both electrodes of a capacitor incorporated in the multilayer substrate. In the procedure, first, a dielectric layer 25 is formed on the entire uppermost surface on the first main surface 2 of the glass core substrate 1, including unnecessary portions of the surface from which the dielectric layer 25 is to be removed later. As a dielectric, silicon nitride is laminated by sputtering to have a thickness of 200 nm.

Then, as shown in FIG. 9(b), a titanium layer 36 is formed on the entire upper surface of the dielectric layer 25. The titanium layer 36 has a role as an adhesive layer for forming an upper electrode of the capacitor in a later step. The titanium layer 36 is laminated by sputtering to have a thickness of 50 nm.

Then, as shown in FIG. 10(a), a copper layer 37 is laminated on the entire upper surface of the titanium layer 36, which is the uppermost layer on the first main surface 2 of the glass core substrate 1. The copper layer 37 has a role as a conductive seed for electrolytic copper plating in a later step. The copper layer 37 is laminated by sputtering to have a thickness of 300 nm.

Next, as shown in FIG. 10(b), a photoresist layer 44 is formed on the copper layer 37, which is the uppermost layer on the first main surface 2 of the glass core substrate 1, and then the photoresist layer 44 is patterned by photolithography to have a shape obtained by removing a portion of the photoresist at which the upper electrode of the capacitor is to be formed later by electrolytic copper plating.

Figure 11:
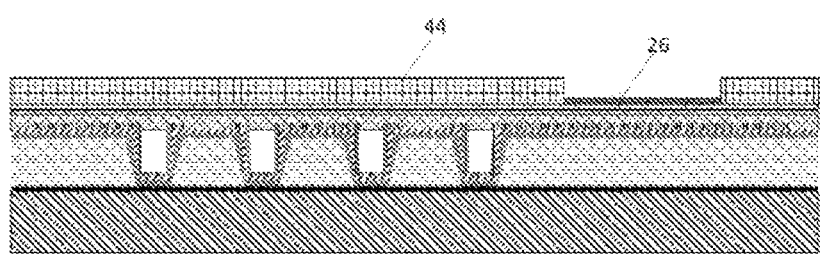
Figure 11:
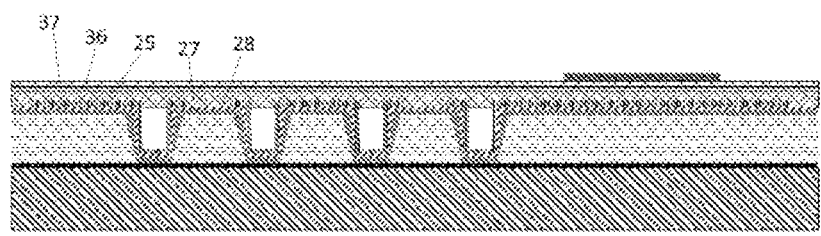

Then, as shown in FIG. 11(*a*), electrolytic copper plating is applied to the first main surface 2 of the glass core substrate 1 to form an upper electrode 26 of the capacitor. In this case, the plating thickness of the upper electrode 26 is set to 8 µm.

After electrolytic plating, as shown in FIG. 11(*b*), the photoresist layer 44 is peeled off. At this stage, excess layers are laminated on the first main surface 2 of the glass core substrate 1, except for the portion of the first main surface 2 on which the upper electrode 26 of the capacitor is provided. On a portion of the first main surface 2 of the glass core substrate 1 that has the wiring pattern, as excess layers, the dielectric layer 25, the titanium layer 36, and the copper layer 37 are laminated. On a portion of the first main surface 2 of the glass core substrate 1 that has no wiring pattern, as excess layers, the titanium layer 27, the copper layer 28, the dielectric layer 25, the titanium layer 36, and the copper layer 37 are laminated in this order from bottom to top on the first main surface 2 of the glass core substrate 1. Thus, in the next step, the excess layers are sequentially removed.

First, as shown in FIG. 12, a photoresist layer 44 is used to cover the components constituting the capacitor 9 (FIG. 1), i.e., the upper electrode 26, the dielectric layer 25 under the upper electrode 26, and a part of the copper layer 29 onto which the upper electrode 26 is projected (the lower electrode 24 shown in FIG. 3), in order to protect these layers from being removed together with unnecessary layers removed in a later step of removing the unnecessary layers.

Figure 13:
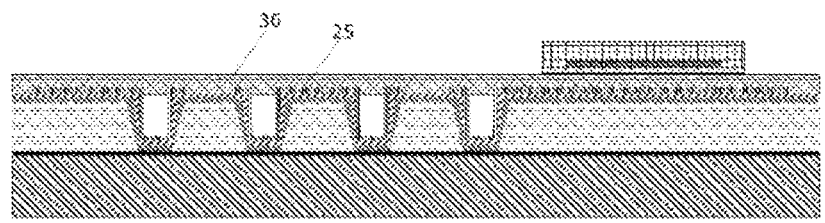
Figure 13:
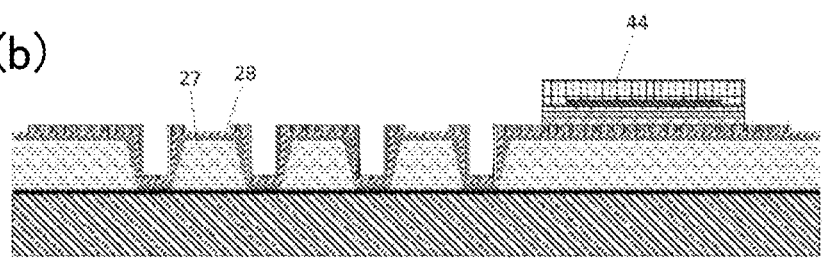

Then, as shown in FIG. 13(*a*), the copper layer 37 formed by sputtering, which is the uppermost layer of the unnecessary layers, is removed by soft etching.

Then, as shown in FIG. 13(*b*), the titanium layer 36 and the dielectric layer 25 composed of silicon nitride located under the titanium layer 36 are removed. These layers may be removed by dry etching. However, the removal method is not limited to this, and may be appropriately selected as desired.

Figure 14:
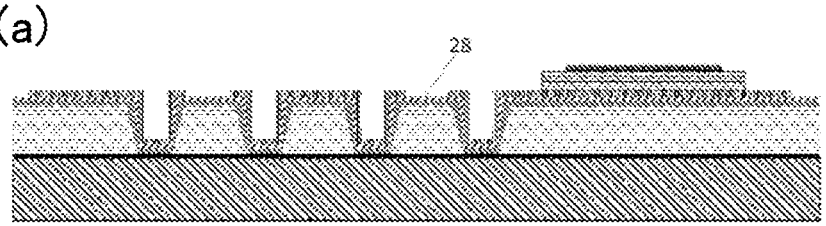
Figure 14:
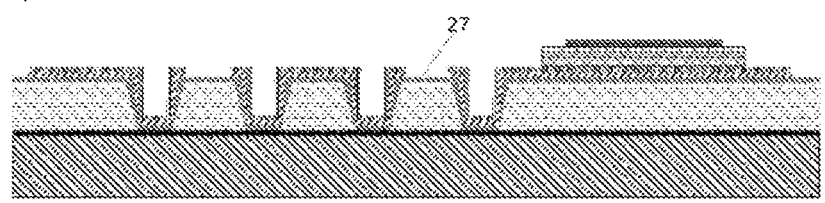

Then, as shown in FIG. 14(*a*), the photoresist layer 44 covering the capacitor is removed. This is because the copper layer constituting the wiring pattern can play a role in protecting the copper layer and layers under the copper layer in the later step of removing the unnecessary layers.

Then, as shown in FIG. 14(*b*), the copper layer 28 formed by sputtering and laminated as an excess layer on the portion of the first main surface 2 of the glass core substrate 1 that has no wiring pattern is removed by soft etching.

Figure 15:
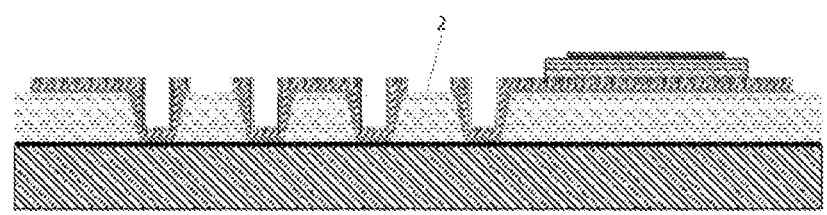
Figure 15:
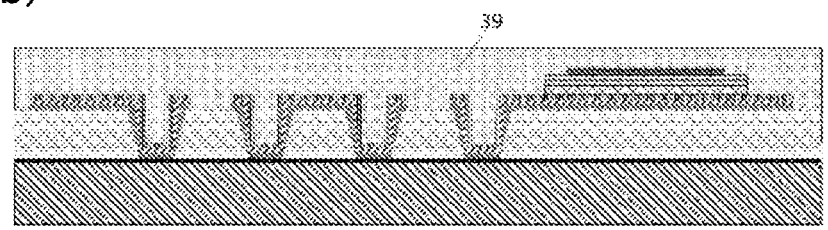

Then, as shown in FIG. 15(*a*), the titanium layer 27 formed by sputtering and laminated as an excess layer on the portion of the first main surface 2 of the glass core substrate 1 that has no wiring pattern is removed by etching. Thus, the first main surface 2 of the glass core substrate 1 is exposed at the portion of the first main surface 2 of the glass core substrate 1 that has no wiring pattern.

Then, as shown in FIG. 15(*b*), an insulating resin sheet is laminated on the first main surface 2 side of the glass core substrate 1 to form an insulating resin layer 39. In the present embodiment, as the insulating resin sheet, an insulating resin (trade name "ABF-GX-T31R") manufactured by Ajinomoto Fine-Techno Co., Inc. may be laminated using a vacuum press laminator. However, the insulating resin sheet and the lamination method are not necessarily limited to these, and may be appropriately selected. The insulating resin sheet may have a thickness of 25 The insulating resin sheet is required to have a thickness sufficient to completely cover the wiring layer on the first main surface 2 of the glass core substrate 1 and the capacitor. In the present embodiment, an insulating resin sheet having a thickness of 25 µm is sufficient when the thickness of the layers from the first main surface 2 of the glass core substrate 1 to the upper electrode 26 of the capacitor including the primer layers and the like is approximately 21 µm.

In the step of forming the insulating layer described above, the insulating resin 39 is also filled in the through holes 4. Due to the use of the vacuum press laminator, the insulating resin layer 39 is completely filled without voids in the through holes 4 in which the seed layer 19 and the main conductive layer 20 are conformally laminated in a tubular shape; thus, the insulating resin layer 39 in the through holes 4 is integrated with the insulating resin layer 39 on the first main surface 2 of the glass core substrate 1.

Figure 16:
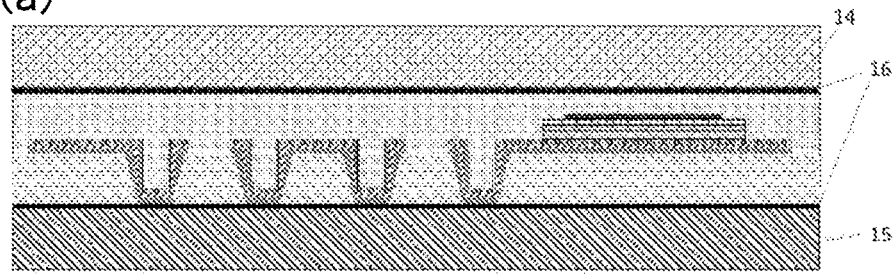
Figure 16:
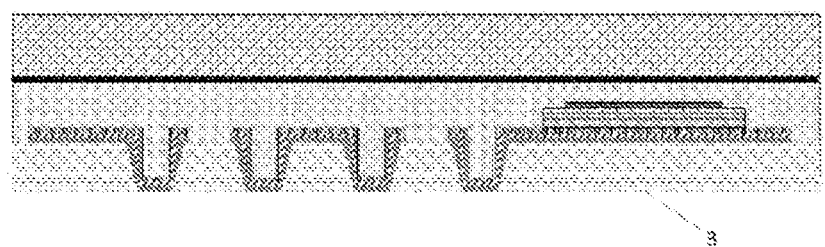

Then, as shown in FIG. 16(*a*), a carrier glass (glass plate) 14 having a thickness of 500 µm is attached onto the insulating resin layer 39 on the first main surface 2 side of the glass core substrate 1. An adhesive layer 16 with low adhesion having a thickness of 10 µm is provided on the entire surface of the carrier glass 14. Thus, the carrier glass 14 is attached to the insulating resin layer 39 via the adhesive layer 16.

Then, as shown in FIG. 16(*b*), the carrier glass 15 on the second main surface 3 side of the glass core substrate 1 is peeled off. The carrier glass is manually peeled off. When the present inventors actually peeled off the carrier glass, and observed the adhesive surface after peeling using an optical microscope (at a magnification of 100 times), no conductive layer or glass attached to the adhesive surface was observed.

Figure 17:
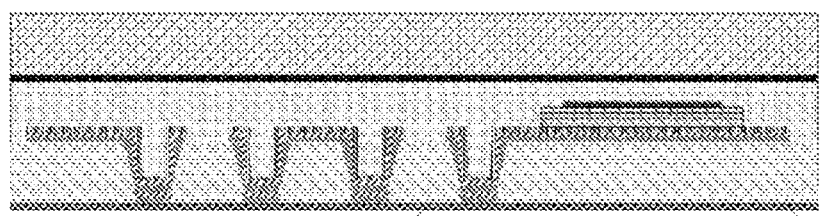
Figure 17:
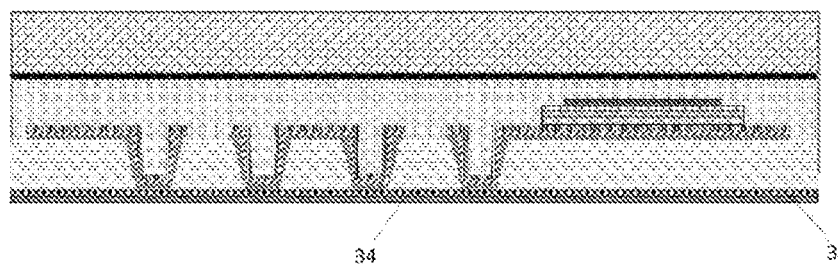

Then, a wiring layer is formed on the second main surface 3 of the glass core substrate 1. As shown in FIGS. 17(*a*) and (*b*), first, a titanium layer 33 having high adhesion to the glass core substrate 1 is formed on the second main surface 3 of the glass core substrate 1, and then a copper layer 34 is formed on the titanium layer 33. The two types of layers are preferably formed successively by sputtering without opening a chamber of a film forming apparatus. In this case, the processing is performed so that the titanium film has a thickness of 50 nm and the copper film has a thickness of 300 nm, but the thicknesses of the layers are not limited to these.

Figure 18:
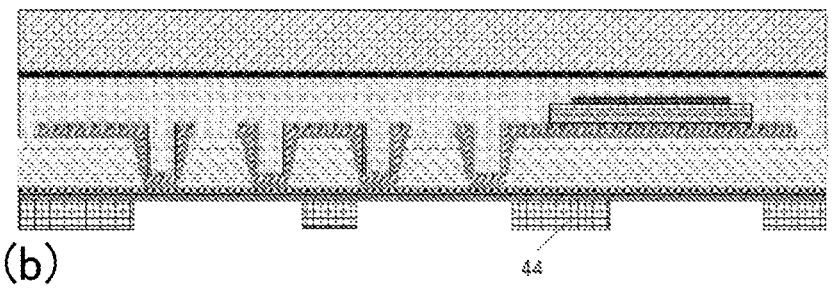
Figure 18:
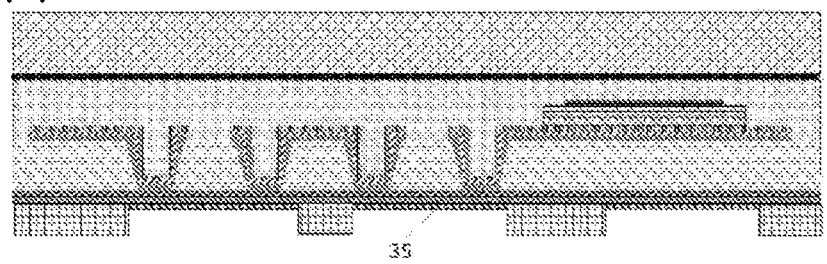

Then, as shown in FIG. 18(*a*), a photoresist layer 44 is formed on the second main surface 3 side of the glass core substrate 1, and the photoresist layer 44 is patterned to expose a portion of the photoresist layer to be a wiring pattern later. In this case, the photoresist layer has a thickness of 20 µm, but the thickness of the photoresist layer is not limited to this.

Then, as shown in FIG. 18(*b*), an electrolytic copper plating 35 is applied to the second main surface 3 of the glass core substrate 1 to form a wiring pattern. The plating thickness is preferably set to 8 µm, but is not limited to this.

Figure 19:
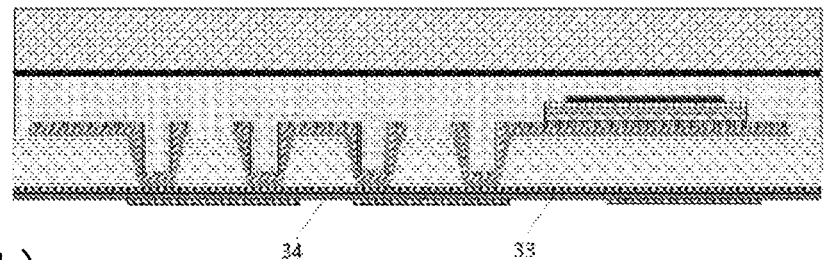
Figure 19:
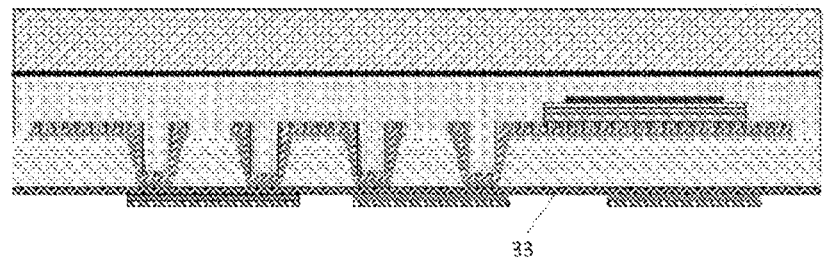

After electrolytic plating, as shown in FIG. 19(*a*), the photoresist layer 44 is peeled off. At this stage, the titanium layer 33 formed by sputtering and the copper layer 34 formed by sputtering remain as excess layers on the second main surface 3 of the glass core substrate 1, except for the portion of the second main surface 3 that has the wiring pattern. Then, these layers are sequentially removed.

First, as shown in FIG. 19(*b*), the copper layer 34 formed by sputtering is dissolved and removed by soft etching. In this case, part of the copper constituting the wiring pattern is also dissolved. However, the wiring pattern has a much larger thickness than the copper layer formed by sputtering; thus, relatively, the wiring pattern is hardly affected by this step.

Then, as shown in FIG. 20(a), the titanium layer 33 formed by sputtering is dissolved and removed by etching. At this stage, the glass is exposed at the portion of the second main surface 3 of the glass core substrate 1 that has no wiring pattern.

Then, as shown in FIG. 20(b), an insulating resin sheet is laminated on the second main surface 3 side of the glass core substrate 1 to form an insulating resin layer 41. In the present embodiment, as the insulating resin sheet, an insulating resin (trade name "ABF-GX-T31R") manufactured by Ajinomoto Fine-Techno Co., Inc. may be laminated using a vacuum press laminator. However, the insulating resin sheet and the lamination method are not necessarily limited to these, and may be appropriately selected. In this case, the insulating resin sheet may have a thickness of 25 μm. The insulating resin sheet is required to have a thickness sufficient to completely cover the wiring layer on the second main surface 3 of the glass core substrate 1. In the present embodiment, in terms of balancing the layer thickness on the first main surface 2 and the layer thickness on the second main surface 3, the insulating resin sheet preferably has a thickness of 25 μm when the thickness of the layers from the second main surface 3 of the glass core substrate 1 to the upper surface of the wiring layer including the primer layers and the like is approximately 10 μm.

Then, as shown in FIG. 21(a), the carrier glass 14 on the first main surface 2 side of the glass core substrate 1 is peeled off. The carrier glass is manually peeled off. When the present inventors actually peeled off the carrier glass, and observed the adhesive surface after peeling using an optical microscope (at a magnification of 100 times), no insulating layer attached to the adhesive surface was observed.

At this stage, the wiring layers are provided on both surfaces of the glass core substrate 1, and the insulating resin layers 39 and 41 are further laminated on the respective wiring layers. The glass core substrate 1 at this stage has appropriate rigidity, and thus there is no risk of damage to the glass core substrate 1 during handling or the like. Accordingly, in the subsequent steps, no carrier glass is required to be attached to the glass core substrate 1.

First, as shown in FIG. 21(b), the insulating resin layer 39 on the first main surface 2 side of the glass core substrate 1 and the insulating resin layer 41 on the second main surface 3 side of the glass core substrate 1 are sequentially processed to form through holes (insulating layer through holes) 10 for electrical connection. The processing is preferably performed using a laser processing machine so that the through holes 10 have a tapered shape with a top diameter of φ60 μm and a bottom diameter of φ45 μm. However, the processing method and the diameter and shape of the holes are not limited to these, and may be appropriately selected according to the purpose.

Although not shown, after laser processing, the through holes 10 are preferably desmeared using a liquid containing a potassium permanganate aqueous solution as a main component. The purpose of desmearing is to remove the resin dissolved by laser processing from the bottom portion of the holes to completely expose the conductor at the bottom portion of the holes and to appropriately roughen the resin surface to improve the adhesion of a wiring seed layer (described later).

If the through holes 4 are not covered on the second main surface 3 side of the glass core substrate 1, during processing for forming the through holes 10, the insulating resin layer 39 is provided at the openings of the through holes 4. Thus, even when the through holes 10 are formed in the insulating resin layer to continue to the through holes 4 and a conductive material is filled in the through holes 10, the insulating resin layer 39 provided between the through holes 10 and the through holes 4 prevents electrical connection between the conductive material in the through holes 10 and the conductor layer on the inner wall of the through holes 4.

In this regard, in the present embodiment, the openings of the through holes 4 are covered with the conductor (cover conductor layer) on the second main surface 3 side of the glass core substrate 1. Thus, by forming the through holes 10 filled with a conductive material to continue to the through holes 4 (in this case, by arranging the through holes 10 so that the through holes 10 overlap with the through holes 4 as viewed in the thickness direction of the glass core substrate 1), the through electrode of the through holes 4 is electrically connected to the conductive material in the through holes 10. The through holes 4 and 10 can connect the wiring layer on the first main surface 2 side of the glass core substrate 1 to the wiring layer on the surface of the insulating resin layer 41 facing away from the glass core substrate 1, thus ensuring a reduction in size of a high-frequency module including the wiring substrate and increasing the degree of freedom in design. In the present embodiment, at necessary positions, the through holes 10 are formed at portions of the insulating resin layer 39 that are located above the through holes 4.

Thus, in the wiring substrate of the present embodiment, via stacking with the glass core through electrode is possible only on the second main surface 3. Therefore, it is effective to design the wiring substrate so that a conductive layer is disposed on the second main surface 3 side for an efficient use of space with densely arranged wires.

Then, as shown in FIG. 22(a), as conductive seed layers, a copper layer 12 is laminated by electroless plating on an inner wall of the through holes 10 formed in the insulating resin layer, and a copper layer 42 is laminated by electroless plating on the surfaces of the insulating resin layers on the first main surface 2 side and the second main surface 3 side of the glass core substrate 1. The conductive seed layers may have a thickness of 500 nm, but the thickness of the conductive seed layers is not limited to this. In the processing in this step, the entire substrate is immersed in a chemical solution tank, and the first main surface 2 and the second main surface 3 are simultaneously processed. The material and processing method for forming the conductive seed layers are not limited to these, and may be appropriately selected according to the purpose.

Then, as shown in FIG. 22(b), a photoresist layer 44 is used to form a pattern on each of the resin layers laminated on the first main surface 2 side and the second main surface 3 side of the glass core substrate 1, and only a portion of the photoresist layer intended to be a wiring layer is exposed.

Then, as shown in FIG. 23(a), the portion exposed from the photoresist pattern is electrolytic copper plated by electrolytic plating. As a result, an electrolytic plating layer 43 is laminated on the electroless copper plating layer 42 on the insulating resin layers, and an electrolytic plating layer 13 is laminated on the electroless plating layer 12 in the through holes 4. In the through holes 4, by adjusting the conditions for electrolytic copper plating in advance, it is possible to form not a conformal electrolytic copper layer but an electrolytic copper layer having a filled via shape in which the through holes 4 are filled with the electrolytic copper layer. The copper layer preferably has a thickness of 12 μm. The thickness of the copper layer and the lamination method are not limited to these, and may be appropriately selected according to the purpose. Then, as shown in FIG. 23(b), the photoresist layers 44 are peeled off and removed.

Subsequently, soft etching is performed to remove portions of the electroless copper plating layers on the insulator layers laminated on the first main surface 2 side and the second main surface 3 side of the glass core substrate 1 that have no electrolytic copper plating layer for wiring. Thus, the wiring substrate shown in FIG. 24 is obtained.

As shown in FIG. 25, if necessary, an insulating layer 7 and a conductive layer 6 may be laminated on one or both surfaces of the substrate so that the substrate includes more layers. This achieves a compact high-frequency module including a high-frequency filter.

In the present embodiment, the conductive layer in the through holes 4 in the glass core substrate 1 has a structure with a bottom (cover), in order to achieve a glass substrate highly suitable for high frequencies with a stacked via structure for reduction in size, which is a significant requirement for the field of communication devices, i.e., a major field of application of such a glass substrate.

The area of the opening of the through holes 4 on the first main surface 2 is preferably larger than the area of the opening of the through holes 4 on the second main surface 3. The through holes 4 having such a shape can be obtained, for example, by forming through holes from the first main surface 2 side using a laser beam.

At least one of the seed layers is preferably formed by sputtering.

In order to achieve the structure of the present embodiment, it is preferable to form a layer disposed directly on the inner wall of the through holes 4 in the glass core substrate by using a method such as sputtering that has directivity and can form chemical species (particles such as atoms or molecules) having high energy. In order to form a layer having a sufficient thickness on the side wall of the through holes by a method having directivity, the through holes 4 preferably have a tapered shape and have a side wall that is slightly inclined upward.

At least one of the main conductive layers is preferably formed by electroplating.

In order to achieve the structure of the present embodiment, it is important to obtain a seed layer with no defects and then laminate a main conductive layer with less variation in thickness on the seed layer; thus, it is preferable to use electroplating, which also allows layer formation at relatively high speed.

The seed layer on the first main surface preferably has a thickness of 1 μm or less.

The role of the seed layer is to provide a surface state suitable for formation of a main conductive layer by lamination of a layer having high adhesion to glass. Thus, as a matter of course, a seed layer having an excessively small thickness is inappropriate, but a seed layer having an excessively large thickness is more likely to lead to the occurrence of cracks or the like and high cost, which is not preferable. It has been confirmed by experiment that the seed layer preferably has a thickness of 1 μm.

The main conductive layer on the first main surface preferably has a thickness of 1 μm or more and 30 μm or less.

The main conductive layer has a role in allowing transmission of an electrical signal enabling the wiring substrate to exhibit its performance. Thus, the main conductive layer is required to be formed to have no short circuits or open circuits and have a size with minimum deviation from the design value in a preferable economical range without using excess material or manufacturing time. It has been confirmed by experiment that the main conductive layer preferably has a thickness of 1 μm or more and 30 μm or less.

At least one of the through electrodes that include the insulating layer laminated on the second main surface of the glass core substrate 1 and on the wiring layer disposed directly on the second main surface and include the conductive layer laminated on the insulating layer and that penetrate the insulating layer and electrically connect the conductive layers above and below the insulating layer is preferably overlapped with the bottom of the through electrodes on the second main surface side of the glass core substrate 1.

By covering the through holes with the bottom composed of the conductive layer, it is possible to perform via stacking on the conductive layer and allow optimization and higher efficiency of wiring arrangement on the substrate, thus enabling the substrate to have a smaller size.

By electrically connecting the through holes in the glass core substrate, the seed layer and the main conductive layer can be laminated to conformally cover the side wall of the through holes and the bottom of the through holes on the second main surface side.

[Reference Signs List] 1: Glass core substrate; 2: First main surface; 3: Second main surface; 4: Through hole; 5: Through conductive via; 6: Conductive layer; 7: Insulating layer; 8: Inductor; 9: Capacitor; 10: Insulating layer through hole; 11: Insulating resin layer through electrode; 12: Electroless copper plating layer in insulating resin layer through hole; 13: Electrolytic plating copper in insulating resin layer through hole; 14: Glass carrier (carrier material) attached to first main surface; 15: Glass carrier (carrier material) attached to second main surface; 16: Adhesive layer of glass carrier; 17: Seed layer on first main surface; 18: Main conductive layer on first main surface; 19: Seed layer of through electrode; 20: Main conductive layer of through electrode; 21: Stacked via portion; 22: Wire on first main surface; 23: Wire on second main surface; 24: Lower electrode of capacitor; 25: Dielectric layer of capacitor; 26: Upper electrode of capacitor; 27: Titanium layer on first main surface; 28: Sputtered copper layer on first main surface; 29: Electrolytic copper plating layer on first main surface; 30: Titanium layer in through hole; 31: Sputtered copper layer in through hole; 32: Electrolytic copper plating layer in through hole; 33: Titanium layer on second main surface; 34: Sputtered copper layer on second main surface; 35: Electrolytic copper plating layer on second main surface; 36: Titanium layer on capacitor dielectric layer; 37: Sputtered copper layer on capacitor dielectric layer; 38: Electrolytic copper plating layer on capacitor dielectric layer; 39: Insulating resin layer on first main surface side; 40: Insulating resin filled in glass through hole; 41: Insulating resin layer on second main surface side; 42: Electroless copper plating layer on insulating resin layer; 43: Electrolytic copper plating layer on insulating resin layer; 44: Photoresist layer.

What is claimed is:

1. A glass core wiring substrate incorporating a high-frequency filter, comprising:
    a glass core substrate having a first main surface and a second main surface opposite to the first main surface;
    a glass through hole penetrating the glass core substrate from the first main surface to the second main surface, wherein
    in the glass through hole, a through electrode comprising a hollow cylindrical conductor layer and a cover conductor layer, the hollow cylindrical conductor layer comprising a seed layer having adhesion to glass and a main conductive layer having conductivity, laminated in this order on an inner wall of the glass through hole, the cover conductor layer being comprising a portion of the seed layer and a portion of the main conductive layer of the hollow cylindrical conductor layer extending to block an end of the glass through hole on the second main surface, the hollow cylindrical conductor layer and the cover conductor layer being sequentially connected, thus forming an inductor;

a conductor layer adhered to the second main surface of the glass core substrate and placed in contact with the cover conductor layer of the through electrode, a multilayer structure comprising a conductor layer, an insulator layer, and a conductor layer laminated in this order on the first main surface or the second main surface, said multilayer structure representing a capacitor, the capacitor and the inductor being connected to each other to constitute a high-frequency LC filter, an insulator layer disposed on the second main surface and having insulating layer through holes overlapping a respective glass through hole as viewed in a thickness direction of the glass core substrate, and a conductive material disposed in the insulating layer through holes and connected to the cover conductor layer of the through electrode.

2. The glass core wiring substrate incorporating a high-frequency filter of claim 1, wherein an opening of the glass through hole on the first main surface has a larger area than an opening of the glass through hole on the second main surface.

3. The glass core wiring substrate incorporating a high-frequency filter of claim 1, wherein the seed layer is formed by sputtering.

4. The glass core wiring substrate incorporating a high-frequency filter of claim 1, wherein the main conductive layer is formed by electroplating.

5. The glass core wiring substrate incorporating a high-frequency filter of claim 1, wherein the seed layer has a thickness of 1 μm or less.

6. The glass core wiring substrate incorporating a high-frequency filter of claim 1, wherein the main conductive layer has a thickness of 1 μm to 30 μm.

7. A high-frequency module comprising the glass core wiring substrate incorporating a high-frequency filter of claim 1, wherein an electrode section represented by the inductor and the capacitor is provided to be exposed from an outermost layer of the wiring substrate, and a high-frequency component is connected to the electrode section.

8. A method of manufacturing a glass core wiring substrate incorporating a high-frequency filter, the method comprising:

forming at least two glass through holes extending from a first main surface to a second main surface of a glass core substrate;

attaching a carrier material to the second main surface;

forming a conductor layer on the first main surface and the second main surface of the glass core substrate;

forming a hollow cylindrical conductor layer along an inner wall of the glass through holes and forming a cover conductor layer on the carrier material that covers ends of the glass through holes on the second main surface;

the hollow cylindrical conductor layer comprising:

(a) a seed layer having adhesion to glass and (b) a main conductive layer, laminated in this order on an inner wall of the glass through hole, the cover conductor layer comprising:

a portion of the seed layer and a portion of the main conductive layer of the hollow cylindrical conductor layer extending to block an end of the glass through hole on the second main surface;

peeling off and removing the carrier material from the second main surface;

forming an inductor by sequentially connecting the hollow cylindrical conductor layer and the cover conductor layer in the glass through holes; and forming a capacitor by using the conductor layer formed on the first main surface or the second main surface, said capacitor comprising a multilayer structure comprising a conductor layer, an insulator layer and a conductor layer laminated in this order; and connecting the inductor and the capacitor to each other to constitute a high-frequency LC filter.

9. The method of claim 8, wherein the seed layer is formed by sputtering.

10. The method of claim 9, wherein the main conductive layer is formed by electroplating.

11. The method of claim 8, wherein the main conductive layer is formed by electroplating.

* * * * *